US006628217B1

(12) United States Patent
Dunne

(10) Patent No.: US 6,628,217 B1
(45) Date of Patent: Sep. 30, 2003

(54) SIGNAL SCALING SCHEME FOR A DELTA SIGMA MODULATOR

(75) Inventor: Anthony G. Dunne, Cork (IE)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/916,978

(22) Filed: Jul. 27, 2001

(51) Int. Cl.[7] .............................................. H03M 3/00
(52) U.S. Cl. ........................ 341/143; 341/118; 341/120; 341/144; 341/155; 341/156
(58) Field of Search ................. 341/118, 155, 341/144, 120, 143, 156

(56) References Cited

U.S. PATENT DOCUMENTS

| | | | | |
|---|---|---|---|---|
| 5,057,839 A | * | 10/1991 | Koch | 341/143 |
| 5,691,720 A | * | 11/1997 | Wang et al. | 341/143 |
| 5,874,912 A | * | 2/1999 | Hasegawa | 341/161 |
| 5,995,035 A | * | 11/1999 | Signell et al. | 341/163 |
| 6,097,326 A | * | 8/2000 | Opris et al. | 341/161 |
| 6,147,522 A | * | 11/2000 | Rhode et al. | 327/93 |
| 6,255,974 B1 | * | 7/2001 | Morizio et al. | 341/143 |

OTHER PUBLICATIONS

"The Design of Sigma–Delta Modulation Analog–to–Digital Converters", By Bernhard E. Boser and Bruce A. Wooley, IEEE Journal of Solid–State Circuits, vol. 23, No. 6, Dec. 1988, pp. 1298–1308.

* cited by examiner

*Primary Examiner*—Michael Tokar
*Assistant Examiner*—Linh Van Nguyen
(74) *Attorney, Agent, or Firm*—Christopher P. Maiorana, P.C.

(57) ABSTRACT

An apparatus comprising a reference generation circuit and a modulator. The reference generation circuit, may be configured to generate a first one or more reference voltages and a second one or more reference voltages. The modulator may be configured to present an output signal in response to an input signal, the first reference voltages and the second reference voltages. A gain between the output signal and the input signal may be set by a capacitor ratio in said modulator.

20 Claims, 3 Drawing Sheets

SIGNAL SCALING SCHEME FOR A DELTA SIGMA MODULATOR

FIELD OF THE INVENTION

The present invention relates to a method and/or architecture for implementing second order delta sigma modulators generally and, more particularly, to a method and/or architecture for efficient and accurate scaling of input and reference signals to avoid saturation in modulator integrators.

BACKGROUND OF THE INVENTION

Conventional delta sigma analog-to-digital converters consist of a modulator followed by a digital filter. The purpose of the modulator is to digitize an analog input signal and shape the noise spectrum such that the quantization noise is forced to high frequencies. The digital filter (typically a low pass digital filter) then removes the high frequency noise to provide an improved signal-to-noise ratio (SNR). The modulator can be first, second, third, etc. order depending on a number of integrators. Higher order modulators force more of the noise to higher frequencies for a given oversampling rate. Therefore, a better SNR is achieved with higher order modulators. However, higher order modulators have increased stability problems and are difficult to design.

Referring to FIG. 1, a conventional second order delta sigma modulator 10 is shown. The modulator 10 consists of two fully differential integrators 12 and 14 followed by a latching comparator 16 and a flip flop 18. The outputs of the flip flop 18 M_OUT and M_OUT_b drive switches that generate the reference voltages VREF1 and VREF2 which are essentially the DAC output voltages. The modulator 10 generates a 1 bit data stream. Therefore, the modulator 10 uses a 1 bit DAC to guarantee ideal differential nonlinearity (DNL). Higher bit DACs can also be used to achieve higher throughput rates at the expense of higher potential DNL.

Two different reference voltage levels can be used with the modulator 10, an external reference level EXT_REF_P (equal to VCC) and an internal reference level. INT_REF (equal to twice the on chip bandgap voltage). The internal reference level INT REF is used when an absolute reference level is required (e.g., in monitoring a battery voltage), The external reference level EXT_REF_P enables ratiometric operation with a level equal to VCC. The reference negative level in each mode is REF_N and typically equals 0V. Depending on the outputs M_OUT and M_OUT_b, the levels VREF1 and VREF2 will be at the positive or negative reference levels (for a given mode) which ensures negative feedback such that the integrators 12 and 14 do not saturate.

Typically, gain levels of the integrators 12 and 14 should be less than 1 and the input signal ANALOG_IN must be attenuated to ensure no degradation in SNR over the input range. An input gain factor of 0.5 and integrator gain factors of 0.25 together with a bandgap gain of 2 provide a reasonable input range for an internal reference mode.

When the switches P1 are active, the first integrator 12 is auto zeroed and the analog inputs ANALOG_IN are being sampled together with VREF1 on the upper side and VREF2 on the lower side. The autozero switch P1 is opened first while the switches P1_DEL connected to the analog inputs ANALOG_IN and the VREF1 and VREF2 signals, respectively, are opened a short delay after. The integrator 12 avoids a signal dependent charge injection error, since the input nodes ANALOG IN are presented to an operational amplifier 20 and have high impedance during the delay interval. Additionally, the switches P1, P1_DEL, and P2 and P2_DEL may be driven by non-overlapping clocks. Next, the switches P2 and P2_DEL turn on. The left hand sides of the input capacitors C are then connected to AGND which is typically half the effective reference range. Since the feedback capacitors equal 4C, the integrator 12 has a gain of ¼.

The voltages VREF1 and VREF2 are multiplied by ¼ while the input ANALOG_IN is multiplied by ½*¼ or ⅛. The switching arrangement of the switches and the integration switches P1, P1_DEL, P2 and P2_DEL is such that VREF1 has the opposite polarity of ANALOG_IN_P, (i.e., there is negative feedback). The location of the feedback switches P2_DEL in series with the feedback capacitors 4C causes charge injection error, since the outputs of the integrator 12 will have different voltage levels.

The modulator 10 has one or more of the following disadvantages:

the input signal ANALOG_IN needs to be attenuated with respect to the reference level;

the bandgap voltage needs to be gained appropriately to have a reasonable input range; and/or charge injection error due to the location of the feedback switch in series with the integrator feedback capacitors.

SUMMARY OF THE INVENTION

The present invention concerns an apparatus comprising a reference generation circuit and a modulator. The reference generation circuit may be configured to generate a first one or more reference voltages and a second one or more reference voltages. The modulator may be configured to present an output signal in response to an input signal, the first reference voltages and the second reference voltages. A gain between the output signal and the input signal may be set by a capacitor ratio in said modulator.

The objects, features and advantages of the present invention include providing a method and/or architecture for implementing a second order delta sigma modulator that may (i) set a gain by selecting capacitor ratios, (ii) provide well controlled gains, (iii) provide lower power dissipation, (iv) not need additional active circuitry (e.g., operational amplifiers) and accurate resistors, (v) be implemented in standard CMOS process and/or (vi) lower charge injection error due to placement of feedback switches.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
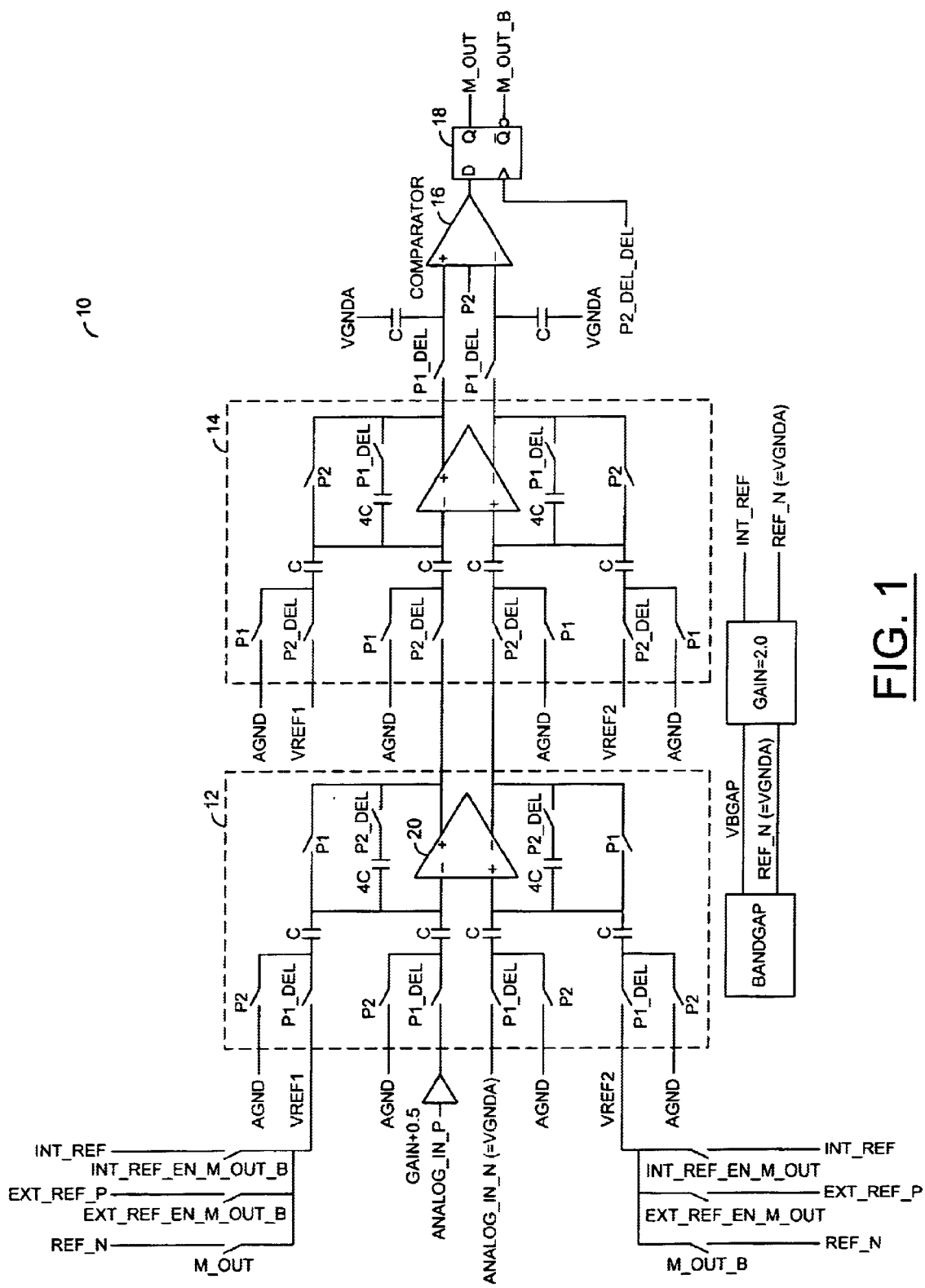
FIG. 1 is a schematic of a typical second order delta sigma modulator.
Figure 2:
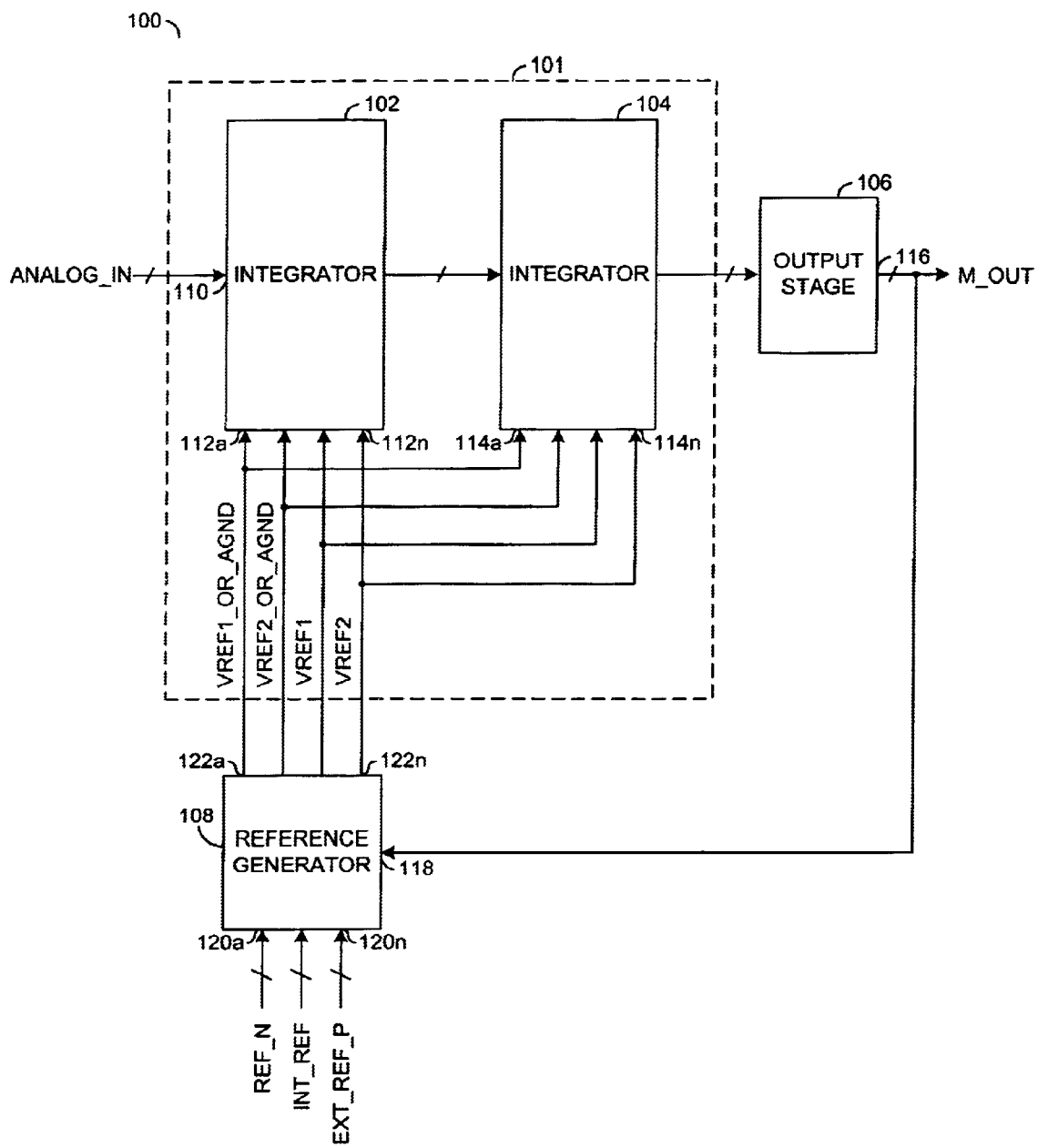
FIG. 2 is a block diagram of a preferred embodiment of the present invention.

Referring to FIG. 2, a block diagram of a block (or circuit) 100 is shown in accordance with a preferred embodiment of the present invention. The circuit 100 may provide enhancements to typical second order delta sigma modulators. The circuit 100 may allow input and reference signals to be efficiently and accurately scaled in order to avoid saturation in modulator integrators. Avoiding saturation may cause signal to noise ratio (SNR) of an ADC to be improved. The circuit 100 may configure a feedback switch and capacitor to minimize charge injection errors.

The circuit 100 generally comprises a modulator device (or circuit) 101. The modulator 101 may comprise an integrator 102 and an integrator 104. The circuit 100 may also comprise an output stage 106 and a reference generator circuit 108. The circuit 100 may provide a second order modulator (e.g., the integrators 102 and 104). However, the particular order (e.g., second order, third order, etc.) of the circuit 100 may be varied in order to meet the criteria of a particular implementation. The reference generator 108 may be implemented as a digital-to-analog converter (DAC).

The integrator 102 may have an input 110 that may receive a signal (e.g., ANALOG_IN) and a number of inputs 112a–112n that may receive a number of signals (e.g., VREF1_OR_AGND, VREF2_OR_AGND, VREF1 and VREF2). The signal ANALOG_IN may have a positive component (e.g., ANALOG_IN_P) and a negative component (e.g., ANALOG_IN_N). The integrator 102 may also present a signal to the integrator 104. The integrator 104 may have a number of inputs 114a–114n that may receive the signals VREF1_OR_AGND, VREF2_OR_AGND, VREF1 and VREF2. The integrator 104 may present a signal to the output stage 106. The output stage 106 may have an output 116 that may present a signal (e.g., M_OUT).

The signal M_OUT may be presented to an input 118 of the reference generator 108. The reference generator 108 may also have a number of inputs 120a–120n that may receive a number of signals e.g., REF_N, INT_REF and EXT_REF_P) and a number of outputs 122a–122n that may present the signals VREF1_OR_AGND, VREF2_OR_AGND, VREF1 and VREF2. The signal EXT_REF_P may be an externally generated reference level. The signal INT_REF may be an internally generated reference level. The reference generator circuit 100 may generate the signals VREF1_OR_AGND, VREF2_OR_AGND, VREF1 and VREF2 in response to the signals REF_N, INT_REF and EXT_REF_P and the feedback M_OUT. The signal VREF1_OR_AGND may present the voltage potential VREF1, when in a first mode and the ground potential AGND when in a second mode. The signal VREF2_0R_AGND may present the voltage potential VREF2 when in the first mode and the ground potential AGND when in the second mode. Additionally, the various signals of the present invention may be implemented as multi-bit or single-bit signals.

Figure 3:
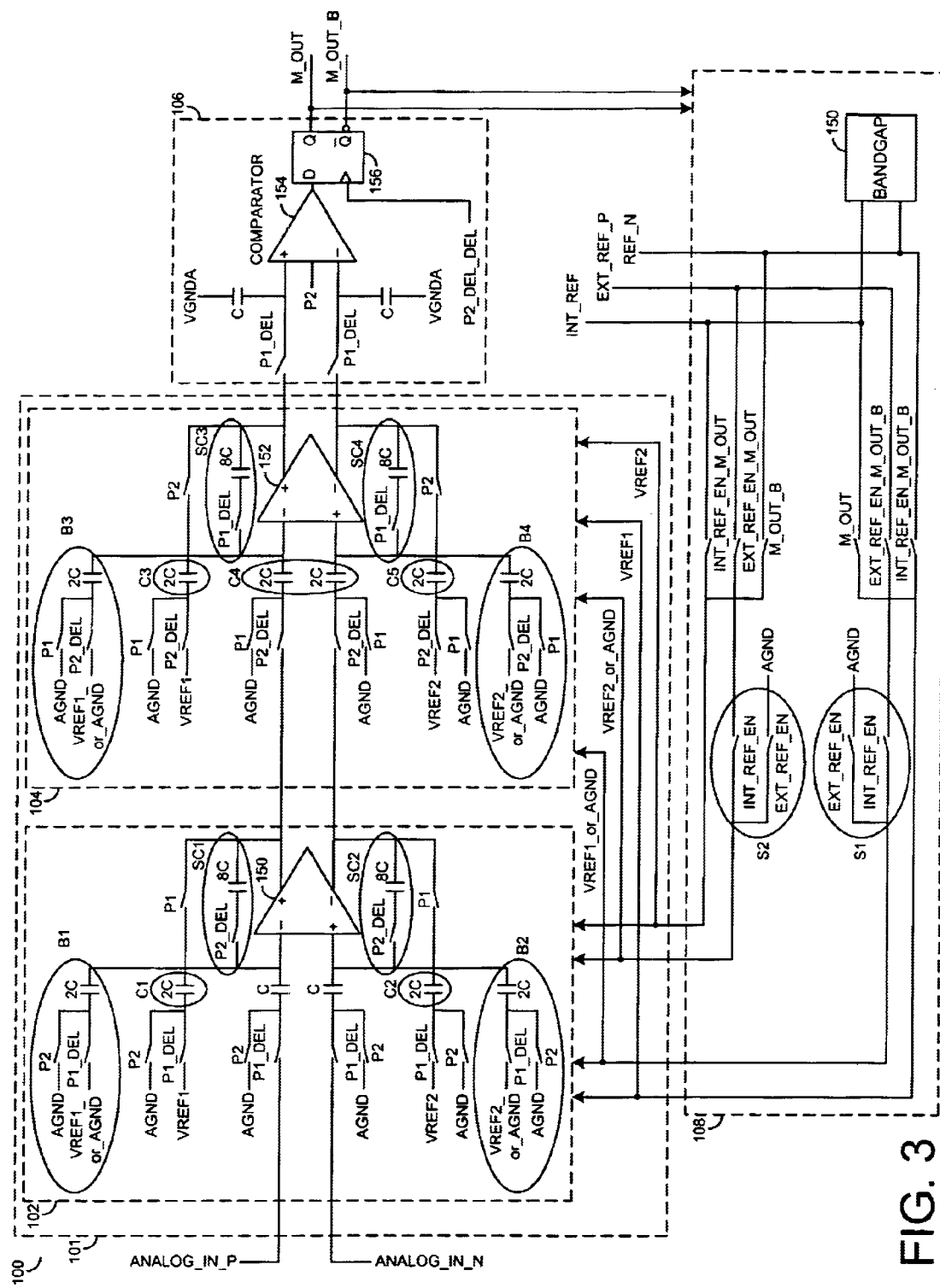
FIG. 3 is a schematic of the circuit of FIG. 2.

Referring to FIG. 3, a detailed schematic of the circuit 100 is shown. The integrator 102 generally comprises a number of switches (e.g., P1), a number of switches (e.g., P1_DEL), a number of switches (e.g., P2), a number of switches (e.g., P2_DEL), a number of capacitors (e.g., C), a number of capacitors (e. g., 2C), a number of capacitors (e.g., 8C)and an operation amplifier 150. The integrator 104 generally comprises a number of switches (e.g., P1), a number of switches (e.g., P1_DEL), a number of switches (e.g., P2), a number of switches (e.g., P2_DEL), a number of capacitors (e.g., 2C) a number of capacitors (e.g., 8C) and an operation amplifier 152. The circuit 100 may have a reduced number of operational amplifiers when compared to the circuit 10. For example, the scheme of circuit 10 would need two additional operational amplifiers, one amplifier to provide input attenuation An of 0.5 and another amplifier to gain up the bandgap voltage.

The output stage 106 generally comprises a number of switches (e.g., P1_DEL), a number of capacitors (e.g., C), a comparator 154 and a flip-flop 156. The reference generator 108 generally comprises a number of switches (e.g., INT_REF_EN), a number of switches (e.g., EXT_REF_EN), a switch (e.g., INT_REF_EN_M_OUT), a switch (e.g., EXT_REF_EN_M_OUT), a switch (e.g., M_OUT_b), a switch (e.g., INT_REF_EN_M_OUT_b), a switch (e.g., EXT_REF_EN_M_OUT_b), a switch (e.g., M_OUT), and a bandgap circuit 160.

The various improvements of the circuit 100 over the conventional circuit 10 are generally indicated with ellipses, such as a number of branches (e.g., B1, B2, B3, and B4), a number of capacitances (e.g., C1, C2, C3, C4, and CS), a number of switch/capacitor configurations (e.g., SC1, SC2, SC3, and SC4), and additional switch configurations (e.g., S1, and S2).

The feedback switches (e.g., the switches SC1–SC4) of the integrators 102 and/or 104 may be modified and the associated capacitance values (e.g., 8C) may be changed to meet the design criteria of a particular implementation. Specifically, the locations of the integrator feedback switches (P2_DEL) and the capacitors (e.g., 8C) may be interchanged. The feedback switches P2_DEL and P1_DEL of the switch/capacitor configurations SC1–SC4 may cause charge injection. However, the positive and negative sides (e.g., SC1 and SC2 or SC3 and SC4) may operate at the same voltage causing equal charge injection which may be rejected by the differential nature of the circuit 100.

During the external reference mode of operation, the nodes VREF1_OR_AGND and VREF2_OR_AGND may equal AGND. Therefore, the branches B1, B2, B3, and B4 may not contribute to the charge transfer. For example, the reference voltages VREF1 and VREF2 may be multiplied by $2c/8c=\frac{1}{4}$, while prior techniques would multiply the analog input ANALOG_IN by a gain of $c/8c=\frac{1}{8}$.

During the internal reference mode, the node VREF1_OR_AGND may equal VREF1. Therefore, the signal VREF1 may be multiplied by $(2c+2c)/8c=2*\frac{1}{4}$, or the effective reference level may be 2* VREF and may be multiplied by $\frac{1}{4}$.

The configuration of the integrators 102 and 104 may be applicable to various multiple order modulators (e.g., second order, third order, etc.) to meet the criteria of a particular implementation. The circuit 100 may allow gains that may be set by capacitor ratios that are generally easily controlled. The circuit 100 may have lower power dissipation then conventional techniques. The circuit 100 may not require additional active circuitry (e.g., operational amplifiers) and accurate resistors for input signal attenuation and appropriate reference generation. The circuit 100 may be implemented in standard CMOS processes. The circuit 100 may lower charge injection error due to placement of feedback switches.

The circuit 100 may provide capacitative scaling of the input signals ANALOG_IN and the reference signals VREF1 and VREF2. The circuit 100 may be configured with feedback switches (e.g., the switch/capacitor configurations SC1–SC4) to minimize charge injection errors. The circuit 100 may provide a switching scheme to adjust reference signal gains depending on a mode of operation. Additionally, the circuit 100 may be applicable to a variety of modulator circuits and provide a charge injection scheme that may be used in a variety of switched capacitor type circuits.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
  a reference generation circuit configured to generate a first one or more reference voltages and a second one or more reference voltages in response to an output signal; and
  a modulator configured to generate said output signal in response to an input signal, said first reference voltages and said second reference voltages, wherein (i) a gain between said output signal and said input signal is set by a capacitor ratio in said modulator and (ii) said capacitor ratio is set by a first plurality of switches and associated capacitors in a first mode and a second plurality of switches and associated capacitors in a second mode.

2. The apparatus according to claim 1, wherein said apparatus is configured to perform capacitance scaling of said input signal and said first and second reference voltages.

3. The apparatus according to claim 1, wherein said modulator is further configured having positive and negative sides of said switches and capacitors operating at a same voltage to minimize charge injection errors.

4. The apparatus according to claim 1, wherein said modulator is further configured to adjust reference gains depending on said mode of operation.

5. The apparatus according to claim 1, wherein said reference generator is configured to generate a plurality of said first reference voltages and a plurality of said second reference voltages, wherein said first and second reference voltages are received by said modulator.

6. The apparatus according to claim 1, wherein said modulator comprises a plurality of integrators configured to integrate said input signal.

7. The apparatus according to claim 6, wherein each of said integrators comprise:
  a number of said first plurality of switches; and
  a number of said second plurality of switches, wherein at least one of each of said first and second plurality of switches is configured to receive said first reference voltage and at least another one of each of said first and second plurality of switches is configured to receive said second reference voltage.

8. The apparatus according to claim 1, wherein said first reference voltage comprises a first predetermined voltage level and said second reference voltage comprises a second predetermined voltage level when in said first mode and a third predetermined voltage level when in said second mode.

9. The apparatus according to claim 8, wherein:
  said first predetermined voltage level comprises a first voltage reference level;
  said second predetermined voltage level comprises a second voltage reference level; and
  said third predetermined voltage level comprises a ground voltage level.

10. The apparatus according to claim 1, wherein said reference generation circuit comprises:
  a third and fourth plurality of switches configured to present at least one of said first and second reference voltages; and
  a fifth and sixth plurality of switches configured to present at least another one of said first and second reference voltages.

11. The apparatus according to claim 10, wherein:
  said third plurality of switches are controlled by an internal reference enable signal and an external reference enable signal;
  said fourth plurality of switches are controlled by an internal reference enable output signal, an external reference enable output signal and said output signal;
  said fifth plurality of switches are controlled by said internal reference enable signal and said external reference enable signal; and
  said sixth plurality of switches are controlled by said internal reference enable output signal, said external reference enable output signal and said output signal.

12. The apparatus according to claim 1, further comprising an output circuit coupled to said modulator and configured to generate said output signal.

13. The apparatus according to claim 1, wherein at least one of each of said first and second plurality of switches is configured to receive said first reference voltage and at least another one of each of said first and second plurality of switches is configured to receive said second reference voltage.

14. The apparatus according to claim 6, wherein said reference generation circuit comprises:
  a third and fourth plurality of switches configured to generate at least one of said first and second reference voltages; and a fifth and sixth plurality of switches configured to generate at least another one of said first and second reference voltages.

15. An apparatus comprising:
  means for generating a first one or more reference voltages and a second one or more reference voltages in response to an output signal; and
  means for generating said output signal in response to an input signal, said first reference voltages and said second reference voltages, wherein (i) a gain between said output signal and said input signal is set by a capacitor, ratio and (ii) said capacitor ratio is set by a first plurality of switches and associated capacitors in a first mode and a second plurality of switches and associated capacitors in a second mode.

16. A method for signal scaling, comprising the steps of:
  (A) generating a first one or more reference voltages and a second one or more reference voltages and an output signal;
  (B) generating said output signal in response to an input signal, said first reference voltages and said second reference voltages; and
  (C) controlling a gain between said output signal and said input signal depending on a capacitor ratio, wherein said capacitor ratio is set by a first plurality of switches and associated capacitors in a first mode and a second plurality of switches and associated capacitors in a second mode.

17. The method according to claim 16, wherein step (C) further comprises:
  performing capacitance scaling of said input and reference signals.

18. The method according to claim 16, wherein step (C) further comprises:
  minimizing charge injection errors by having positive and negative sides of said switches and capacitors operating at a same voltage.

19. The method according to claim 16, wherein step (C) further comprises:
  adjusting reference gains depending on said mode of operation.

20. The method according to claim 19, wherein:
  step (A) further comprises generating a plurality of said first reference voltages and a plurality of said second reference voltages; and
  step (B) is responsive to said first and second reference voltages.

* * * * *